United States Patent
Brown et al.

(10) Patent No.: US 10,355,688 B2
(45) Date of Patent: Jul. 16, 2019

(54) CONTROLLED CURRENT MANIPULATION FOR REGENERATIVE CHARGING OF GATE CAPACITANCE

(71) Applicant: Silanna Asia Pte Ltd, Singapore (SG)

(72) Inventors: Cameron Brown, Pymble (AU); Yashodhan Vijay Moghe, Marsfield (AU)

(73) Assignee: Silanna Asia Pte Ltd, Singapore (SG)

( * ) Notice: Subject to any disclaimer, the term of this patent is extended or adjusted under 35 U.S.C. 154(b) by 0 days.

(21) Appl. No.: 15/833,857

(22) Filed: Dec. 6, 2017

(65) Prior Publication Data
US 2019/0173465 A1    Jun. 6, 2019

(51) Int. Cl.
*H02M 1/08* (2006.01)
*H03K 17/687* (2006.01)

(52) U.S. Cl.
CPC ........... *H03K 17/687* (2013.01); *H02M 1/08* (2013.01); *H03K 2217/0036* (2013.01)

(58) Field of Classification Search
CPC ............ H03K 17/687; H03K 17/6871; H03K 17/6872; H03K 17/6874; H03K 17/6877; H03K 17/689; H03K 17/6895; H03K 17/691; H03K 17/693; H03K 2017/6875; H03K 2017/6878; H03K 17/302;
(Continued)

(56) References Cited

U.S. PATENT DOCUMENTS

| | | | |
|---|---|---|---|
| 6,441,673 B1 * | 8/2002 | Zhang ................ | H03K 17/0406 327/110 |
| 8,519,750 B2 * | 8/2013 | Kimura ........... | H03K 17/04123 327/109 |

(Continued)

FOREIGN PATENT DOCUMENTS

| | | |
|---|---|---|
| CN | 104767381 B | 9/2017 |
| JP | 2015015785 A | 1/2015 |
| WO | 2006079219 A1 | 8/2006 |

OTHER PUBLICATIONS

Eberle, Wilson Allan Thomas, "MOSFET Current Source Gate Drivers, Switching Loss Modeling and Frequency Dithering Control for MHz Switching Frequency DC-DC Converters", Thesis submitted Feb. 2008 to Queen's University, Kingston, Ontario, Canada, https://qspace.library.queensu.ca/bitstream/handle/1974/1048/Eberle_Wilson_A_200802_PhD.pdf;jsessionid=B574722A7BD280FBE8EB65D7FC447247?sequence=1.
(Continued)

*Primary Examiner* — Patrick C Chen
(74) *Attorney, Agent, or Firm* — MLO, a professional corp.

(57) ABSTRACT

A circuit for regenerative gate charging includes an inductor coupled to a gate of a FET. An output control circuit is coupled to a timing control circuit and a bridged inductor driver, which is coupled to the inductor. A sense circuit is coupled to the gate and to the timing control circuit, which receives a control signal, generates output control signals in accordance with a first switch timing profile, and transmits the output control signals to the output control circuit. In accordance with the first switch timing profile, the output control circuit holds switches of the bridged inductor driver in an ON state for a first period and holds all of the switches in an OFF state for a second period. Gate voltages are sampled during the second period and after the first period. The timing control circuit generates a second switch timing profile using the sampled voltages.

20 Claims, 9 Drawing Sheets

(58) Field of Classification Search
CPC ........ H02M 1/08; H02M 1/081; H02M 1/082; H02M 1/083; H02M 1/084; H02M 1/0845; H02M 1/088; H02M 1/092; H02M 1/096
USPC ........................................................ 327/427
See application file for complete search history.

(56) References Cited

U.S. PATENT DOCUMENTS

| | | | |
|---|---|---|---|
| 10,020,752 B1* | 7/2018 | Vinciarelli | H02M 3/3376 |
| 2004/0095183 A1* | 5/2004 | Swize | H03K 17/08142 |
| | | | 327/423 |
| 2005/0001659 A1* | 1/2005 | Inoshita | H02M 1/08 |
| | | | 327/108 |
| 2006/0186933 A1 | 8/2006 | Kimura et al. | |
| 2006/0290388 A1 | 12/2006 | Tolle et al. | |
| 2015/0155865 A1 | 6/2015 | Komiyama et al. | |
| 2017/0093282 A1 | 3/2017 | Moghe | |
| 2017/0302178 A1 | 10/2017 | Bandyopadhyay et al. | |

OTHER PUBLICATIONS

International Search Report dated Mar. 11, 2019 for PCT Patent Application No. PCT/IB2018/059140.

* cited by examiner

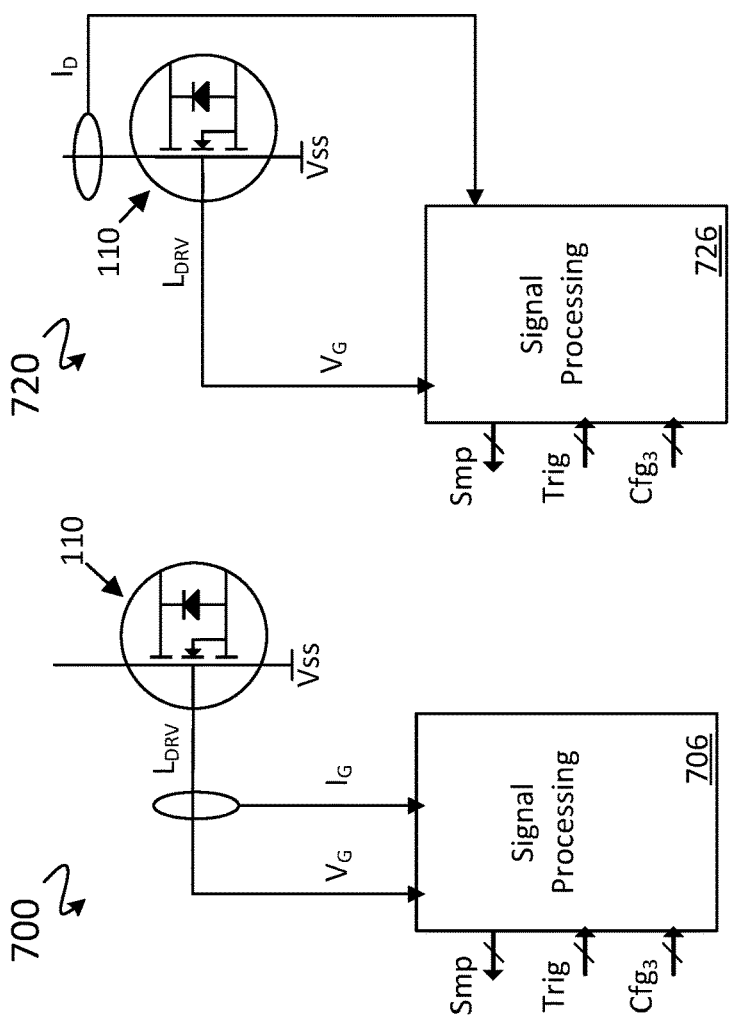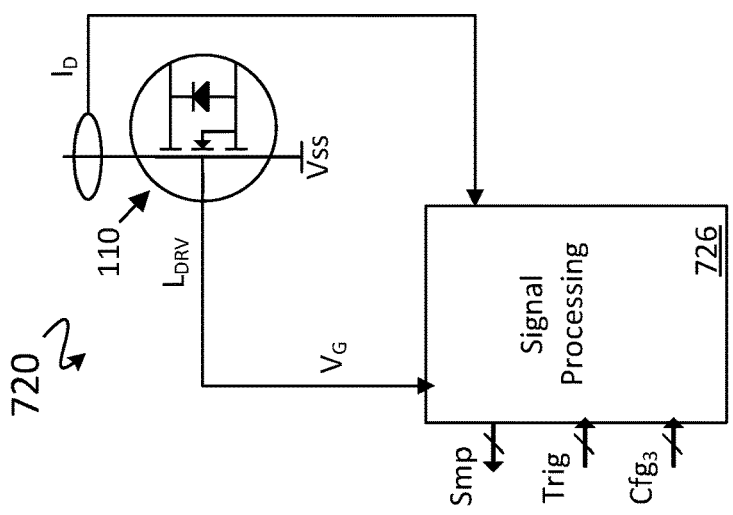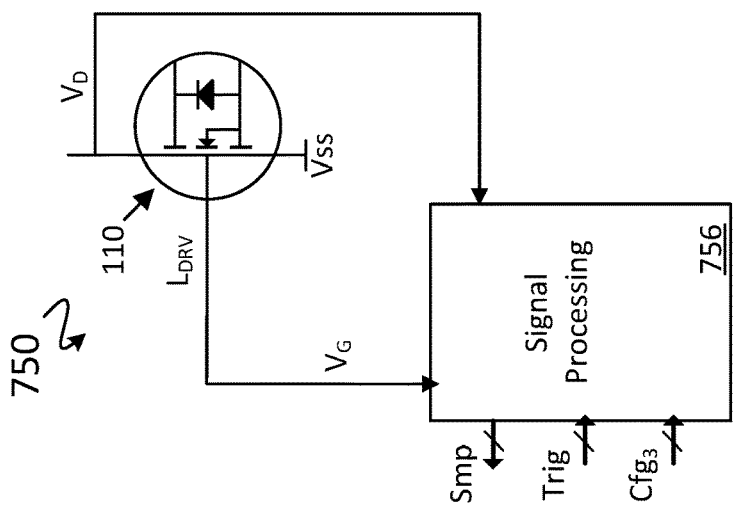

CONTROLLED CURRENT MANIPULATION FOR REGENERATIVE CHARGING OF GATE CAPACITANCE

BACKGROUND

A synchronous switching power converter ("converter") is an electronic power supply that efficiently converts power with the incorporation of at least one switching element, such as a field effect transistor (FET). A buck converter is an example of a synchronous switching power converter. Modern high-efficiency buck converter designs often use a synchronous FET as a rectifier, in place of a diode, to reduce conduction losses from forward diode voltage drop. To further reduce conduction losses, these FETs are made to be physically large. However, large FETs have significant gate capacitance which is charged and discharged every switching cycle. Significant power can be lost due to this capacitance, a problem which is only compounded by higher switching frequencies.

SUMMARY

In some embodiments, a circuit for controlled current manipulation for regenerative charging of gate capacitance includes an inductor having a first terminal and a second terminal. The circuit includes a FET that has a gate node which is coupled to the second terminal of the inductor. A bridged inductor driver circuit is coupled to the first terminal of the inductor and the second terminal of the inductor. The bridged inductor driver circuit includes switches. The circuit includes an output control circuit that is coupled to the bridged inductor driver circuit. A sense circuit is coupled to the gate node, and a timing control circuit is coupled to the output control circuit and to the sense circuit. The timing control circuit receives a first FET control signal at a first trigger time of a first switching cycle. The timing control circuit generates first output control signals in accordance with a first switch timing profile. The timing control circuit transmits the first output control signals to the output control circuit. The output control circuit holds one or more of the switches in an ON state for a first time period. The first time period is in accordance with the first switch timing profile. The output control circuit holds all of the switches in an OFF state for a second time period. The second time period is in accordance with the first switch timing profile. The sense circuit samples one or more first voltages of the gate node during the second time period and after the expiration of the first time period. The timing control circuit uses the sampled one or more first voltages to generate a second switch timing profile for a second switching cycle.

In some embodiments, a method for regenerative gate charging involves receiving a first FET control signal at a first trigger time of a first switching cycle at a timing control circuit. First output control signals are generated in accordance with a first switch timing profile using the timing control circuit. The first output control signals are transmitted to an output control circuit from the timing control circuit. One or more switches of a bridged inductor driver circuit are held in an ON state for a first time period using the output control circuit. The first time period is in accordance with the first switch timing profile, the bridged inductor driver is coupled to an inductor, and a gate node of a FET is coupled to the inductor. All of the switches are held in an OFF state for a second time period using the output control circuit. The second time period is in accordance with the first switch timing profile. One or more voltages of the gate node are sampled during the second time period and after an expiration of the first time period using a sense circuit. The sense circuit is coupled to the gate node and is coupled to the timing control circuit. A second switch timing profile for a second switching cycle is generated using the sampled one or more voltages at the timing control circuit.

BRIEF DESCRIPTION OF THE DRAWINGS

FIGS. 7A-C are simplified schematics of a portion of an example signal processing circuit, in accordance with some embodiments.

DETAILED DESCRIPTION

Improved methods and circuits are described herein for controlled current manipulation for regenerative charging of gate capacitance. Large field effect transistors (e.g., power FETs) such as those used in synchronous switching power converter circuits require significant gate charge that is consumed from the supply rail on every switching cycle. If part of the energy used for charging and discharging the gate is recovered during a switching cycle, energy losses are reduced, and efficiency is improved. As described herein, this energy recovery can be achieved by transferring energy to and from the gate using an inductor. In some embodiments, the inductor and associated control circuitry are implemented in an integrated driver along with the FET as the timing of the control signals for operating the inductor can then be very accurately controlled. The improvement of the timing controls enables the advantage of ensuring optimal charging and discharging of gate capacitance for improved power consumption or minimization of power loss. Additionally, the inductor may be integrated on the same die or in the same package as the FET, which further enhances the advantages enabled by the accurate timing controls for the inductor. Other advantages or improvements of the methods and circuits described herein will also become apparent from the present disclosure.

In some embodiments, such methods and circuits involve circuits for charging and discharging a gate of a FET by controlling the current flow through an inductor coupled to the gate of the FET such that power loss is reduced. Such circuits accept input from a switched-mode controller and switch the FET on and off as determined by a desired duty cycle of the switching power converter. Current flow through the inductor and to the gate of the FET is controlled by a switch timing profile that has static and tunable delay portions. The tunable delay portions of the switch timing profile are adjusted to further reduce power loss in subsequent switching cycles by sampling the gate voltage of the FET at a known time in a charge or discharge cycle of the gate of the FET. The sampled gate voltages are compared to desired voltages as a form of feedback regarding the previous gate charge or discharge cycle. Based on that feedback, the adjustable delay portions of the switch timing profile are tuned (e.g., a delay duration is lengthened or shortened) to modify current flow through the inductor during a subsequent gate charge or discharge cycle.

Figure 1:
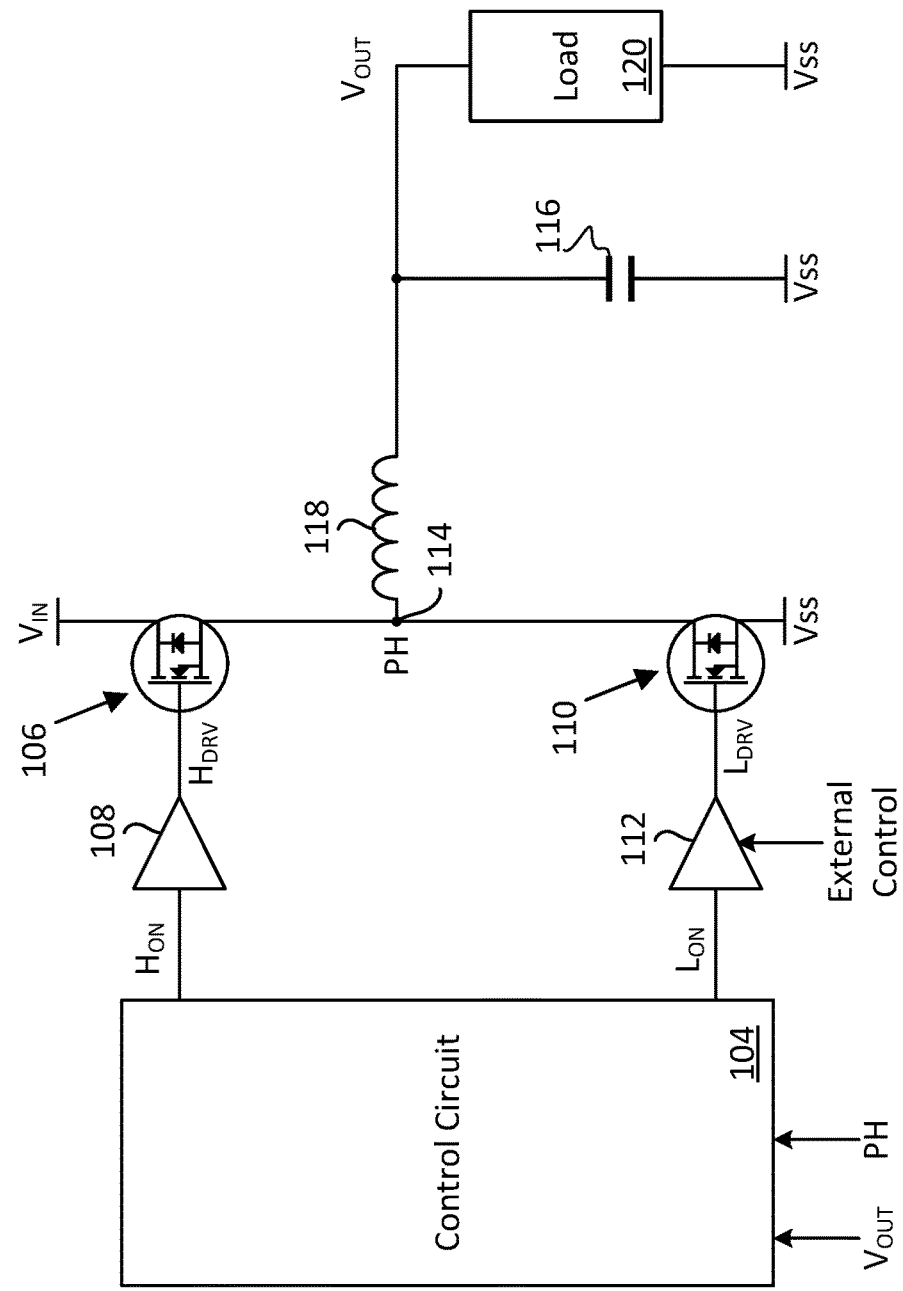
FIG. 1 is a simplified schematic of an example synchronous switching power converter circuit, in accordance with some embodiments.

FIG. 1 is a simplified schematic of an example synchronous switching power converter ("converter") circuit 100 that converts an input voltage $V_{IN}$ at a $V_{IN}$ node to an output voltage $V_{OUT}$ at a $V_{OUT}$ node, in accordance with some embodiments. In general, the converter circuit 100 includes a control circuit 104 that is coupled to a high-side field effect transistor (FET) 106 through a high-side drive circuit 108. The control circuit 104 is also coupled to a low-side FET 110 through a low-side drive circuit 112. A high-side source node of the high-side FET 106 and a low-side drain node of the low-side FET 110 are electrically coupled to the phase node 114, which is electrically coupled to a capacitor 116 through an inductor 118. A phase signal PH is a static or continuously changing voltage at the phase node 114. The control circuit 104 is electrically coupled to the phase node 114 to receive the phase signal PH. A load, such as a load 120, is typically electrically coupled in parallel with the capacitor 116. In some embodiments, the control circuit 104 is electrically coupled to the $V_{OUT}$ node (e.g., through a feedback path to receive $V_{OUT}$). The control circuit 104 receives $V_{OUT}$ and the phase signal PH and may receive other signals which are not shown here for simplicity. The control circuit 104 outputs a signal $H_{ON}$ and a signal $L_{ON}$. The high-side drive circuit 108 receives the $H_{ON}$ signal. The high-side drive circuit 108 buffers, amplifies, level-shifts, or otherwise conditions the signal $H_{ON}$ to produce a signal $H_{DRV}$ that is suitable for turning the high-side FET 106 on and off. The signal $H_{DRV}$ is received at a high-side gate node of the high-side FET 106. Similarly, the low-side drive circuit 112 receives the signal $L_{ON}$. The low-side drive circuit 112 buffers, amplifies, level-shifts, or otherwise conditions the signal $L_{ON}$ to produce a signal $L_{DRV}$ that is suitable for turning the low-side FET 110 on and off. The signal $L_{DRV}$ is received at a gate node of the low-side FET 110. In some embodiments, the low-side drive circuit 112 receives external control signals from the control circuit 104.

Figure 2:
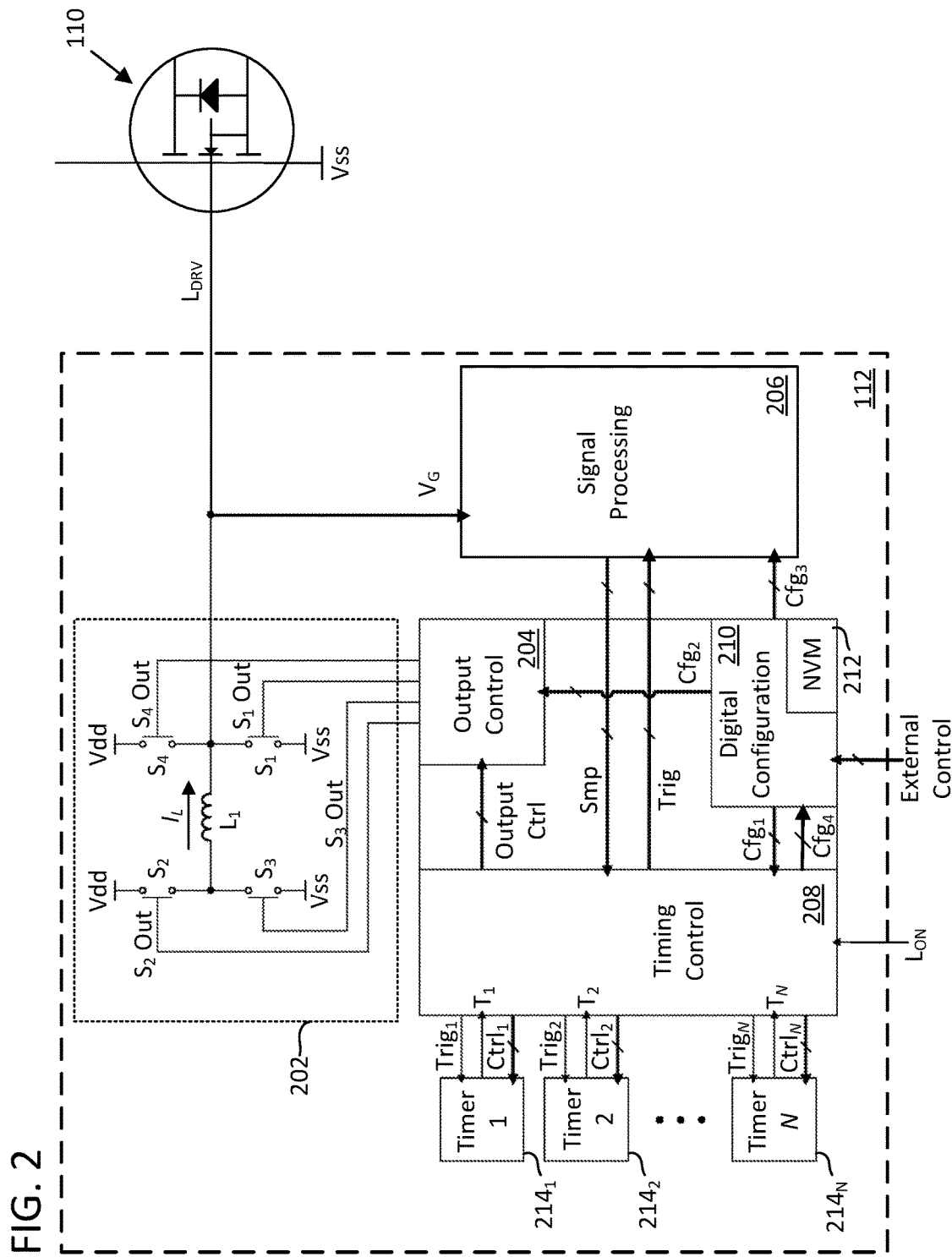
FIG. 2 is a simplified schematic of an example circuit for regenerative charging of gate capacitance, in accordance with some embodiments.

FIG. 2 is a simplified schematic of an example low-side drive circuit 112 for regenerative charging of gate capacitance of the low-side FET 110. The portion of the low-side drive circuit 112 shown includes a timing control circuit 208 that receives the $L_{ON}$ signal and triggers a series of events, timed by timer circuits $214_{1-N}$. The timer circuits $214_{1-N}$ include static delay circuits and adjustable delay circuits to provide static delays, as well as to provide variable (e.g., tunable) delays which are controlled by a configuration provided by the timing control circuit 208. The low-side drive circuit 112 also includes a control loop that adjusts the variable delays based on feedback from previous gate charge/discharge cycles. The initial state of the low-side drive circuit 112 is set, in some embodiments, by a digital configuration circuit 210, which sources configuration data signals $Cfg_{1-3}$ either from a non-volatile source, or an external supervising controller. The timing control circuit 208 outputs a sequence of timed pulses to an output control circuit 204 which contains combinational logic that converts the timed pulses into gate waveforms, and buffers these signals to control current flow through an inductor $L_1$ that is coupled to the gate of the low-side FET 110 to charge or discharge the gate of the low-side FET 110. After the gate of the low-side FET 110 has finished charging or discharging, but the corresponding hold switch (or current source) is not enabled, a signal processing circuit 206 samples the gate voltage of the low-side FET 110 to generate the feedback to the timer control circuit 208 about the performance of the previous cycle.

As shown, the low-side drive circuit 112 generally includes the inductor $L_1$ coupled to the gate node of the low-side FET 110. A bridged inductor driver circuit 202 is coupled to the inductor $L_1$ and to the output control circuit 204. The signal processing circuit 206 is coupled to the gate node of the low-side FET 110. The timing control circuit 208 is coupled to the timer circuits $214_{1-N}$, to the output control circuit 204, to the signal processing circuit 206, and to the digital configuration circuit 210. The digital configuration circuit 210 includes a non-volatile memory (NVM) circuit 212.

In the example embodiment shown, the bridged inductor driver circuit 202 includes switches $S_{1-4}$. Other embodiments of the bridged inductor driver circuit 202 are shown and discussed with reference to FIGS. 8A-9B. The timing control circuit 208 receives the signal $L_{ON}$ from the control circuit 104 and based on that signal turns the low-side FET 110 on or off by charging the gate of the low-side FET 110 up to Vdd or discharging the gate of the low-side FET 110 down to Vss. To turn the low-side FET 110 on or off, the timing control circuit 208, triggered by the signal $L_{ON}$, generates output control signals ("Output Ctrl") and transmits the Output Ctrl signals to the output control circuit 204. The output control circuit 204 uses the Output Ctrl signals to control the bridged inductor driver circuit 202 to cause current to flow to and from the inductor $L_1$ and the gate node of the low-side FET 110. In the example shown, the flow of current is caused by turning one or more of the switches $S_{1-4}$ on or off for a duration of time. In some embodiments, one or more of the switches $S_{1-4}$ is a FET. In other embodiments, one or more of the switches $S_{1-4}$ is a controlled current source or a diode.

The Output Ctrl signals sent to the output control circuit 204 are generated by the timing control circuit 208 in accordance with a switch timing profile. A switch timing profile is a timing sequence that defines or controls the flow of current to and from the inductor $L_1$ and the gate node of the low-side FET 110. Example timing sequences are shown and discussed with reference to FIGS. 4A-5B. In some embodiments, switch timing profiles are stored in, and retrieved from, the digital configuration circuit 210 (e.g., using the NVM circuit 212). A default switch timing profile may be used while the converter circuit 100 reaches a steady state of operation on power-up or after reset.

During specific times during a switching cycle, measurements of the voltage and/or current related to the low-side FET 110 are made by the signal processing circuit 206. A switching cycle is a duration of time in which both FETs 106, 110 have transitioned through full on and off states (e.g., the sequence of turning low-side FET 110 off . . . high-side FET 106 on . . . high-side FET 106 off . . . low-side FET 110 on . . . low-side FET 110 off . . . and so on). In the example shown the voltage $V_G$ of the gate node of the low-side FET 110 is measured by the signal processing circuit 206, but in other embodiments, other currents/voltages related to the low-side FET 110 are measured as well.

These example embodiments are shown and discussed with reference to FIGS. 7A-C. Based on measurements made during the current switching cycle, the switch timing profile used in a subsequent switching cycle is created or updated (e.g., tuned). When the timing control circuit 208 receives a second FET control signal at a second trigger time of a subsequent switching cycle, the timing control circuit 208 generates output control signals in accordance with the updated or generated switch timing profile (based on measured gate voltages from the previous cycle) and transmits updated output control signals to the output control circuit 204. The created or updated switch timing profile can be stored by the digital configuration circuit 210 (e.g., by transmitting configuration signals $Cfg_4$ from the timing control circuit 208 to the digital configuration circuit 210) and be recalled by the digital configuration circuit 210 for later use. An example embodiment of a portion of the signal processing circuit 206 is shown and discussed with reference to FIG. 6.

Upon, or before, receiving the FET control signal $L_{ON}$ during a switching cycle (or upon or before the commencement of that switching cycle), the timing control circuit 208 configures the timer circuits $214_{1-N}$ using respective control signals $Ctrl_{1-N}$ in accordance with a switch timing profile associated with that switching cycle. The switch timing profile used to configure the timer circuits $214_{1-N}$ is either generated/updated in a previous switching cycle or is retrieved (e.g., from the NVM circuit 212) by the digital configuration circuit 210.

Figure 3A:
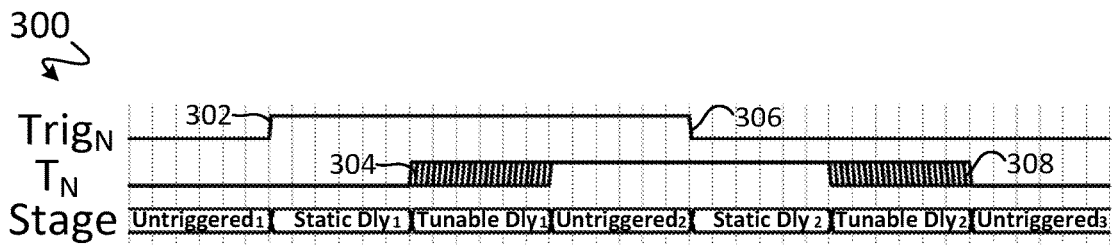
FIG. 3A is a simplified signal timing diagram.

In accordance with the switch timing profile, each of the timer circuits $214_{1-N}$ is configured to apply an amount of static and/or adjustable delay to received trigger signals $Trig_{1-N}$ to produce delayed signals $T_{1-N}$. In some embodiments, each of the trigger signals $Trig_{1-N}$ corresponds to the signal $L_{ON}$. The Output Ctrl signals transmitted from the timing control circuit 208 to the output control circuit 204 include the delayed signals $T_{1-N}$. An example simplified signal timing diagram 300 in FIG. 3A shows the delayed signal $T_N$ generated by the timer circuit $214_N$ as it relates to the trigger signal $Trig_N$ received by the timer circuit $214_N$. After a first untriggered duration of time ("Untriggered$_1$"), a rising edge 302 of a trigger signal $Trig_N$ (e.g., $Trig_3$) is sent from the timing control circuit 208 to the timer circuit $214_N$. After a first static delay duration ("Static Delay$_1$") and a first tunable delay duration ("Tunable Delay$_1$"), a delayed rising edge 304 of delayed signal $T_N$ (e.g., $T_3$) is transmitted from the timer circuit $214_N$ to the timing control circuit 208. After a second untriggered duration of time ("Untriggered$_2$"), a falling edge 306 of the trigger signal $Trig_N$ is transmitted from the timing control circuit 208 to the timer circuit $214_N$. After a second static delay duration ("Static Delay$_2$") and a second tunable delay duration ("Tunable Delay$_2$"), a delayed falling edge 308 of $T_N$ is transmitted from the timer circuit $214_N$ to the timing control circuit 208. The timer circuit $214_N$ remains untriggered for a second duration of time ("Untriggered$_2$").

The timing control circuit 208 transmits $T_N$, as well as other delayed signals (e.g., $T_1$, $T_2$) to the output control circuit 204 as part of the Output Ctrl signals. The output control circuit 204 uses the received Output Ctrl signals to generate signals that control the bridged inductor driver circuit 202, thereby controlling the flow of current through the inductor $L_1$ and to/from the gate node of the low-side FET 110. A portion of an example embodiment of the output control circuit 204 is shown in FIG. 3B.

Figure 3B:
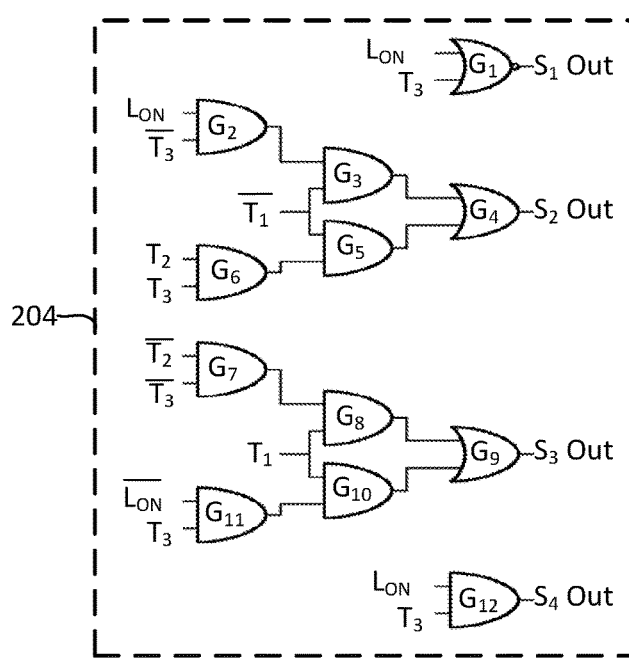
FIG. 3B is a simplified schematic of a portion of an example output control circuit, in accordance with some embodiments.
Figure 3C:
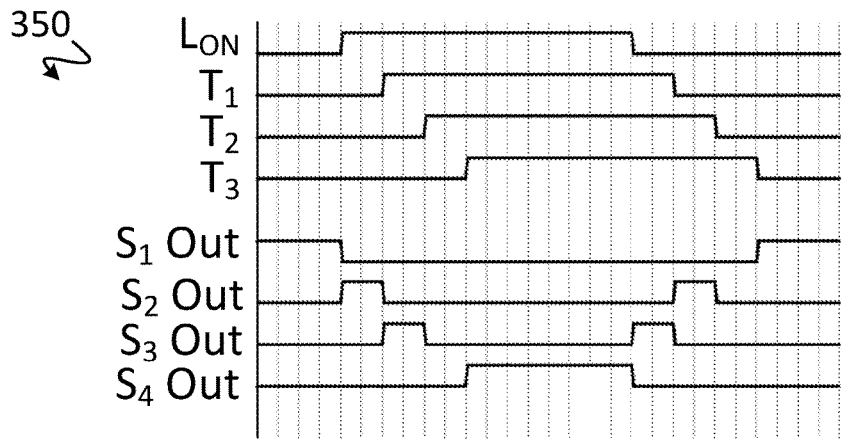
FIG. 3C is a simplified signal timing diagram.

The portion of the circuit shown in FIG. 3B illustrates the logical relationship between inputs and outputs of the output control circuit 204. The output control circuit 204 converts delayed signals $T_{1-3}$ received by the output control circuit 204 into signals $S_{1-4}$ Out. Logic gates $G_{1-12}$, coupled as shown, use delayed signals $T_{1-3}$ and the trigger signal $L_{ON}$ to produce switch control signals $S_{1-4}$ Out. The switch control signals $S_{1-4}$ Out are used to control the bridged inductor driver circuit 202. In some embodiments, the signals $S_{1-4}$ Out are buffered, level-shifted, amplified, or otherwise modified to control the bridged inductor driver circuit 202. In some embodiments, one or more of the switch control signals $S_{1-4}$ Out control a controllable current supply circuit. Details of the logical relationship of $L_{ON}$ and $T_{1-3}$ to $S_{1-4}$ Out, given the example embodiment of the output control circuit 204 shown in FIG. 3B, are shown in the simplified signal diagram 350 of FIG. 3C.

Figure 4A:
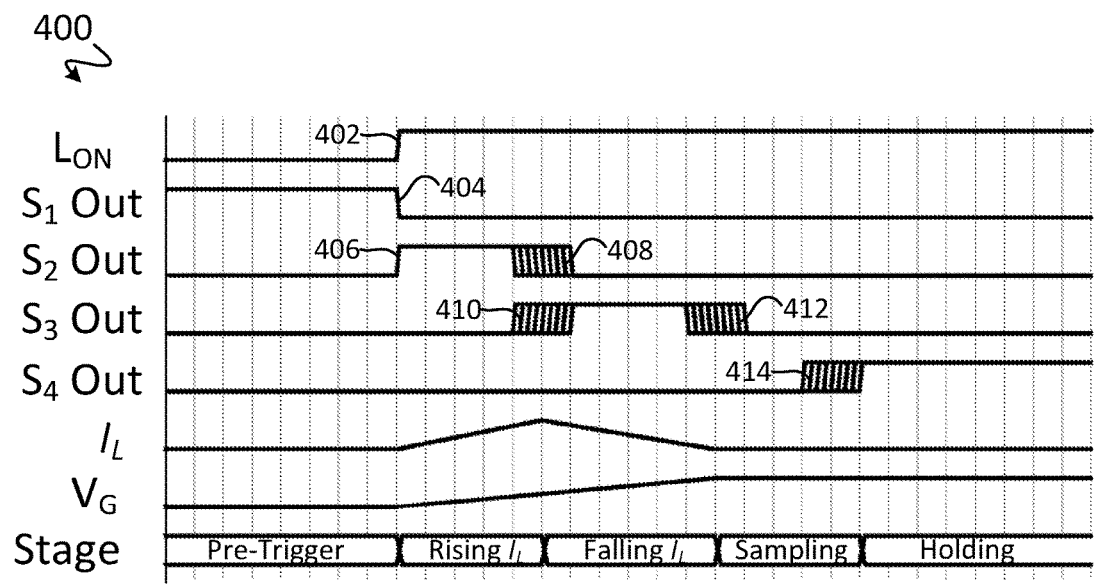
FIGS. 4A-B are simplified signal timing diagrams.

A simplified signal timing diagram 400 of an example 3-stage timing sequence for charging the gate node of the low-side FET 110 (e.g., turning the low-side FET 110 on) is shown in FIG. 4A. Based on the currently used timing profile of the current switching cycle, the timer circuits $214_{1-N}$ shown in FIG. 2 are configured to produced delayed signals $T_{1-3}$ which are received by the output control circuit 204 to generate switch control signals $S_{1-4}$ Out. During a pre-trigger stage, while $L_{ON}$ is de-asserted (e.g., the low-side FET 110 is off), signal $S_1$ Out is asserted, and signals $S_{2-4}$ Out are de-asserted, thus holding the gate node of the low-side FET 110 at Vss. During the pre-trigger stage, the magnitude of current $I_L$ through the inductor $L_1$ is zero. After the pre-trigger stage, a rising edge 402 of $L_{ON}$ is received at the timing control circuit 208 from the control circuit 104 which triggers subsequent transitions of signals $S_{1-4}$ Out. The falling edge 404 of signal $S_1$ Out and the rising edge 406 of signal $S_2$ Out cause a rising magnitude of current $I_L$ to flow into the inductor $L_1$ from Vdd. After a duration of time that includes both static and tunable delays (e.g., the static delay$_1$ and tunable delay$_1$ stages of FIG. 3A), the falling edge 408 of $S_2$ Out and the rising edge 410 of $S_3$ Out cause current sourced from Vdd and the inductor $L_1$ to charge the low-side gate of the low-side FET 110. As the gate voltage $V_G$ rises, the magnitude of current $I_L$ falls. After another duration of time that includes both static and tunable delays (e.g., the static delay$_2$ and tunable delay$_2$ stages of FIG. 3A), the falling edge 412 of $S_3$ Out and the rising edge 414 of $S_4$ Out cause the low-side gate of the low-side FET 110 to be held at Vdd (designated as the "Holding" stage). As shown, the signal processing circuit 206 only samples the gate voltage $V_G$ during the duration of time between the falling edge 412 and the rising edge 414 (designated as the "Sampling" stage). This sampled voltage is used as an input to the control loop (e.g., a "loop" formed as the effects of Output Ctrl on the gate voltage $V_G$ measured by the signal processing circuit 206 at specific times, the sampled voltages being fed back to the timing control circuit 208 to generate new Output Ctrl signals, and so on). The control loop adjusts switch timing profiles used during future cycles (e.g., tuning the tunable delay portions for use in a subsequent switching cycle). During this duration of time, current is not being provided to the gate node of the low-side FET 110 from Vdd and current from the gate node is not being sourced to Vss (e.g., all the switches or current sources of the bridged inductor driver circuit 202 are off). Because the gate voltage $V_G$ is only sampled during this duration of time, the signal processing circuit 206 can be advantageously simplified.

Figure 4B:
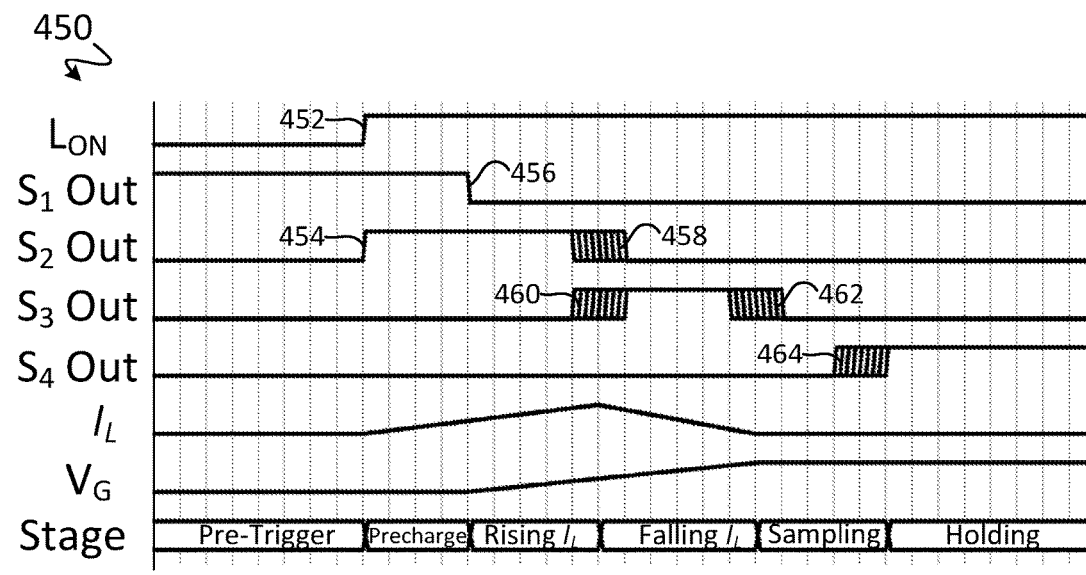

A simplified signal timing diagram 450 of an example 4-stage timing sequence for charging the gate node of the low-side FET 110 (e.g., turning the low-side FET 110 on) is shown in FIG. 4B. The 4-stage timing sequence adds a pre-charge stage to the 3-stage timing sequence discussed with reference to FIG. 4A. During a pre-trigger stage while $L_{ON}$ is de-asserted, signal $S_1$ Out is asserted, and signals $S_{2-4}$ Out are de-asserted, thus holding the gate node of the low-side FET 110 at Vss. During the pre-trigger stage, the magnitude of current $I_L$ through the inductor $L_1$ is zero. After the pre-trigger stage, a rising edge 452 of $L_{ON}$ is received at the timing control circuit 208 from the control circuit 104, the reception of which triggers subsequent transitions of signals $S_{1-4}$ Out. A rising edge 454 of $S_2$ Out causes a rising magnitude of current $I_L$ to flow through the inductor $L_1$ from Vdd to Vss. A falling edge 456 of signal $S_1$ Out causes the current $I_L$ to cease flowing to Vss and instead begin charging the gate node of the low-side FET 110. This causes a rising gate voltage $V_G$. After a duration of time that includes both static and tunable delays, a falling edge 458 of signal $S_2$ Out and a rising edge 460 of signal $S_3$ Out stops the flow of current from Vdd to the inductor $L_1$. Current $I_L$ from the inductor $L_1$ continues to flow to the gate node of the low-side FET 110. This causes the gate voltage $V_G$ of the FET 110 to continue rising while the magnitude of the current $I_L$ falls. After another duration of time that includes both static and tunable delays, the falling edge 462 of $S_3$ Out and the rising edge 464 of $S_4$ Out cause the low-side gate of the low-side FET 110 to be held at Vdd (designated as the "Holding" stage). As shown, the signal processing circuit 206 only samples the gate voltage $V_G$ during the duration of time between the falling edge 462 and the rising edge 464 (designated as the "Sampling" stage). This sampled voltage is used as an input to the control loop for adjusting future cycles. During this duration of time, current is not being provided to the gate node of the low-side FET 110 from Vdd and current from the gate node is not being sourced to Vss.

Figure 5A:
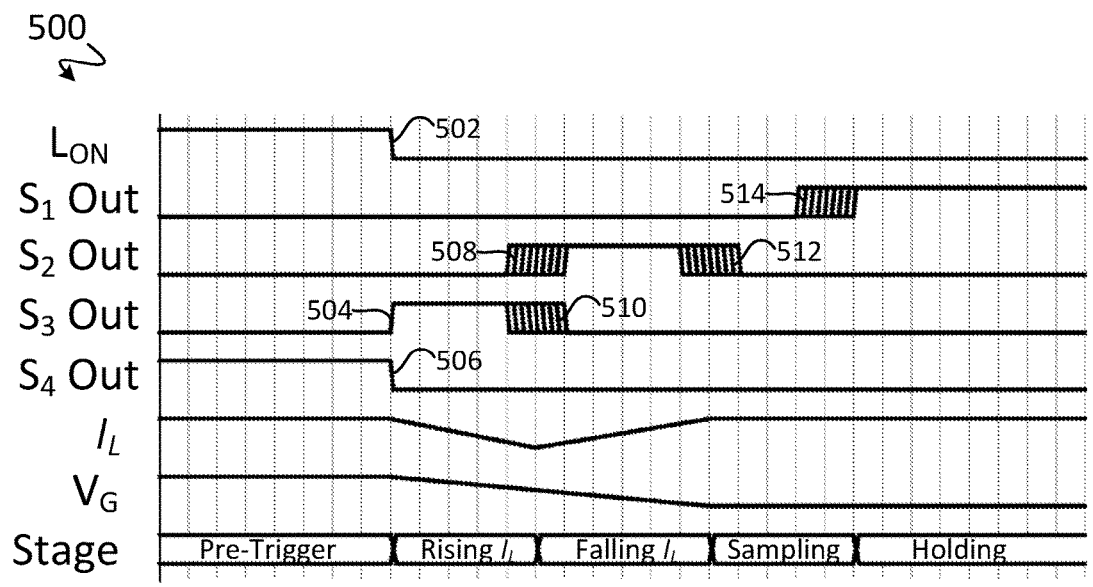
FIGS. 5A-B are simplified signal timing diagrams.

A simplified signal timing diagram 500 of an example 3-stage timing sequence for discharging the gate node of the low-side FET 110 (e.g., turning the low-side FET 110 off) is shown in FIG. 5A. Based on the currently used timing profile of the current switching cycle, the timer circuits $214_{1-N}$ shown in FIG. 2 are configured to produced delayed signals $T_{1-3}$ which are received by the output control circuit 204 to generate switch control signals $S_{1-4}$ Out. During a pre-trigger stage while $L_{ON}$ is asserted (e.g., the low-side FET 110 is on), signal $S_4$ Out is asserted, and signals $S_{1-3}$ Out are de-asserted, thus holding the gate node of the low-side FET 110 at Vdd. During the pre-trigger stage, the magnitude of current $I_L$ through the inductor $L_1$ is zero. After the pre-trigger stage, a falling edge 502 of $L_{ON}$ is received at the timing control circuit 208 from the control circuit 104, the reception of which triggers subsequent transitions of signals $S_{1-4}$ Out. The rising edge 504 of signal $S_3$ Out and the falling edge 506 of signal $S_4$ Out cause a rising magnitude (e.g., away from the steady-state of zero current) of current $I_L$ to flow into the inductor $L_1$ from the gate node of the low-side FET 110, thereby causing the gate voltage $V_G$ to decrease. After a duration of time that includes both static and tunable delays (e.g., the static delay$_1$ and tunable delay$_1$ stages of FIG. 3A), a rising edge 508 of $S_2$ Out and a falling edge 510 of $S_3$ Out causes current to flow through the inductor $L_1$ to Vdd. As the gate voltage $V_G$ continues to decrease, the magnitude of current $I_L$ falls (e.g., returning to a steady state of zero). After another duration of time that includes both static and tunable delays (e.g., the static delay$_2$ and tunable delay$_2$ stages of FIG. 3A), the falling edge 512 of $S_2$ Out and the rising edge 514 of $S_1$ Out cause the low-side gate of the low-side FET 110 to be held at Vss (designated as the "Holding" stage). As shown, the signal processing circuit 206 only samples the gate voltage $V_G$ during the duration of time between the falling edge 512 and the rising edge 514 (designated as the "Sampling" stage). This sampled voltage is used as an input to the control loop for adjusting future cycles. During this duration of time, current from the gate node is not being sourced to Vss (e.g., all the switches or current sources of the bridged inductor driver circuit 202 are off). Because the gate voltage $V_G$ is only sampled during this duration of time, the signal processing circuit 206 can be advantageously simplified.

Figure 5B:
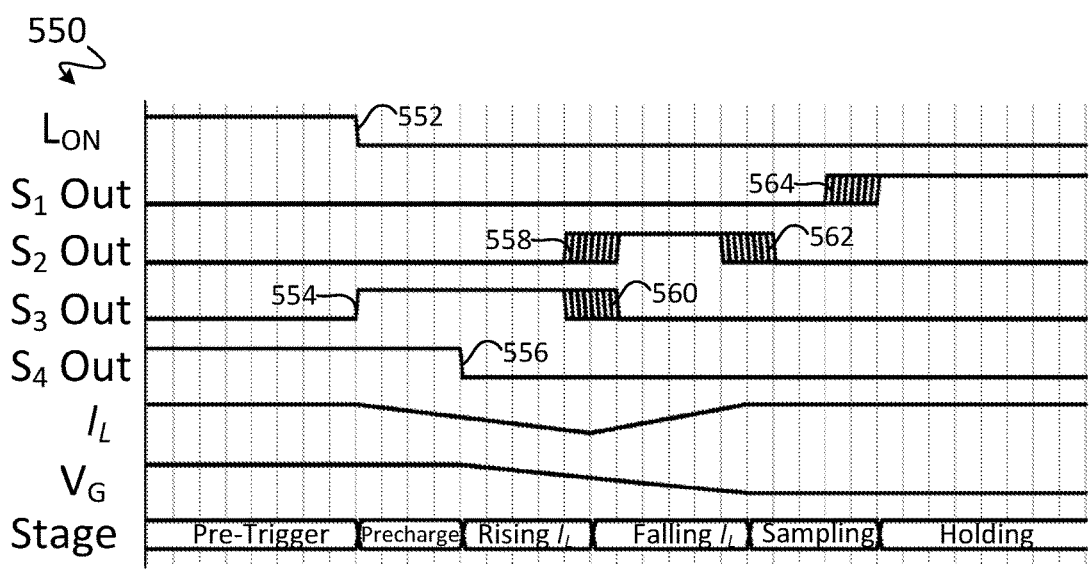

A simplified signal timing diagram 550 of an example 4-stage timing sequence for discharging the gate node of the low-side FET 110 (e.g., turning the low-side FET 110 off) is shown in FIG. 5B. The 4-stage timing sequence adds a Pre-charge stage to the 3-stage timing sequence discussed with reference to FIG. 5A. During a pre-trigger stage while $L_{ON}$ is asserted, signal $S_4$ Out is asserted, and signals $S_{1-3}$ Out are de-asserted, thus holding the gate node of the low-side FET 110 at Vdd. During the pre-trigger stage, the magnitude of current $I_L$ through the inductor $L_1$ is zero. After the pre-trigger stage, a falling edge 552 of $L_{ON}$ is received at the timing control circuit 208 from the control circuit 104, the reception of which triggers subsequent transitions of signals $S_{1-4}$ Out. A rising edge 554 of $S_3$ Out causes a rising magnitude (e.g., away from the steady-state of zero current) of current $I_L$ to flow through the inductor $L_1$ from Vdd to Vss. A falling edge 556 of signal $S_4$ Out causes the current $I_L$ to cease flowing to Vdd and continue flowing from the gate node of the low-side FET 110 to Vss. This causes a decreasing gate voltage $V_G$. After a duration of time that includes both static and tunable delays, a rising edge 558 of signal $S_2$ Out and a falling edge 560 of signal $S_3$ Out causes causes current to flow through the inductor $L_1$ to Vdd. This causes the gate voltage $V_G$ of the FET 110 to continue falling while the magnitude of the current $I_L$ also falls (e.g., approaches the steady-state of zero current). After another duration of time that includes both static and tunable delays, the falling edge 562 of $S_2$ Out and the rising edge 564 of $S_1$ Out cause the low-side gate of the low-side FET 110 to be held at Vss (designated as the "Holding" stage). As shown, the signal processing circuit 206 only samples the gate voltage $V_G$ during the duration of time between the falling edge 562 of $S_2$ Out and the rising edge 564 of $S_1$ Out (designated as the "Sampling" stage). This sampled voltage is used as an input to the control loop for adjusting future cycles. During this duration of time, current from the gate node is not being sourced to Vss (e.g., all the switches or current sources of the bridged inductor driver circuit 202 are off). Because the gate voltage $V_G$ is only sampled during this duration of time, the signal processing circuit 206 can be advantageously simplified.

Figure 6:
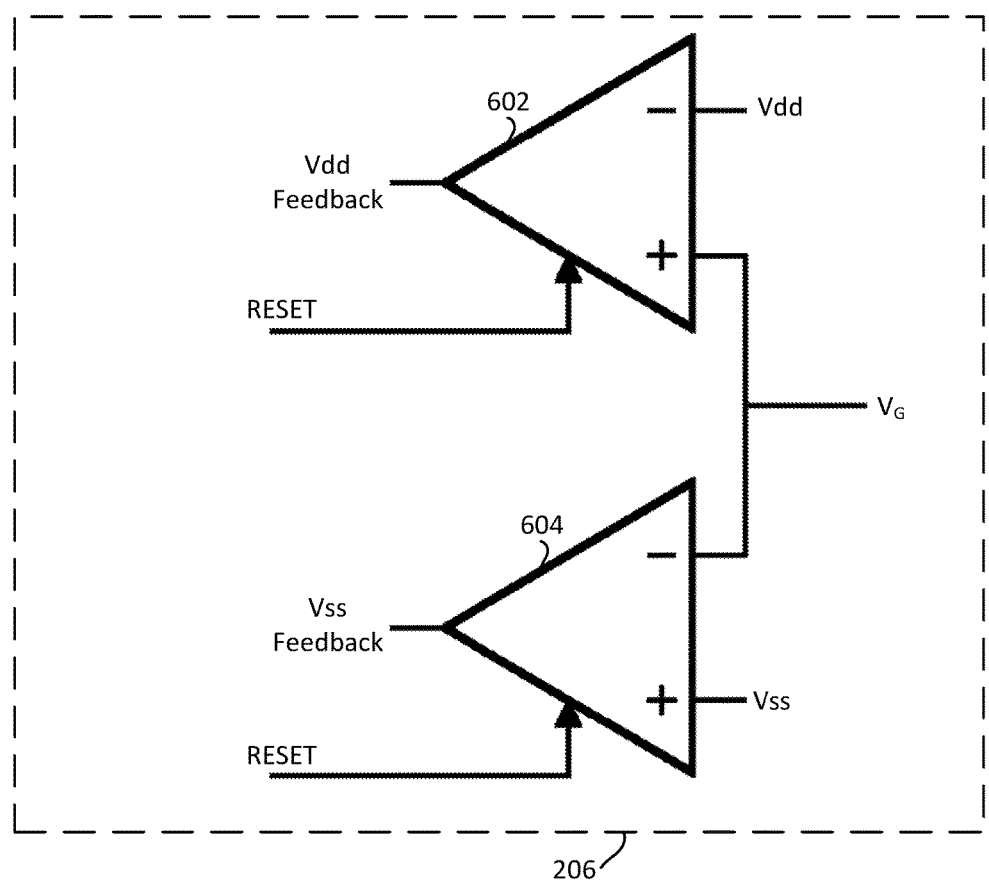
FIG. 6 is a simplified schematic of a portion of an example signal processing circuit, in accordance with some embodiments.

A circuit schematic of an example embodiment of a portion of the signal processing circuit 206 is shown in FIG. 6. Other embodiments of a signal processing circuit for sampling a gate voltage of a FET as are known in the art could be used in some embodiments. In some embodiments, the signal processing circuit 206 includes a digital-to-analog converter instead of, or in addition to, high-speed latching comparators. In the example embodiment shown, the signal processing circuit 206 generally includes a first high-speed latching comparator 602 and a second high-speed latching comparator 604 coupled as shown in FIG. 6. The first comparator 602 receives the gate voltage $V_G$ from the gate node of the low-side FET 110 at a non-inverting input and receives Vdd at an inverting input to compare the gate voltage Vg to the rail-voltage Vdd. The second comparator 604 receives the gate voltage $V_G$ from the gate node of the low-side FET 110 at an inverting input and receives Vss at a non-inverting input to compare the gate voltage Vg to the rail-voltage Vss. Outputs of the comparators 602, 604 (Vdd Feedback and Vss Feedback, respectively) are transmitted to the timing control circuit 208 as part of the "Smp" signals shown in FIG. 2. Additionally, the comparators 602, 604 can receive trigger signals (not shown) and/or reset signals from the timing control circuit 208 as part of the "Trig" signals shown in FIG. 2 to control the reset and subsequent sample latching of the comparators 602, 604. As was discussed with reference to FIGS. 4A-5B, the signal processing circuit 206 advantageously samples the gate voltage only during select times of the switching cycle.

In some embodiments, other voltages and currents related to the low-side FET 110 are measured in addition to the gate voltage $V_G$. Example embodiments of a portion of the signal processing section of the low-side drive circuit 112 are shown in FIGS. 7A-C. Each of the signal processing sections 700, 720 and 750 are coupled to the low-side FET 110 and generally include a respective signal processing circuit 706, 726, 756 which is similar to the signal processing circuit 206. Samples produced by the signal processing circuits 706, 726, 756 are transmitted to the timing control circuit 208 as part of the Smp signals shown in FIG. 2. Additionally, trigger signals are transmitted from the timing control circuit 208 to a respective signal processing circuit 706, 726, 756 as part of the Trig signals shown in FIG. 2. Configuration signals $Cfg_3$ are received the signal processing circuits 706, 726, 756 from the digital configuration circuit 210. As shown in FIG. 7A, in some embodiments, a gate current $I_G$ and the gate voltage $V_G$ of the gate node of the low-side FET are sampled by the signal processing circuit 706 for zero-current-switching. As shown in FIG. 7B, in some embodiments, the gate voltage $V_G$ of the gate node and a drain current $I_D$ of a low-side drain node of the low-side FET are sampled by the signal processing circuit 726 for zero-current-switching. As shown in FIG. 7C, in some embodiments, the gate voltage $V_G$ of the gate node and a drain voltage $V_D$ of the low-side drain node of the low-side FET are sampled by the signal processing circuit 756 for zero-voltage-switching.

Figure 8A:
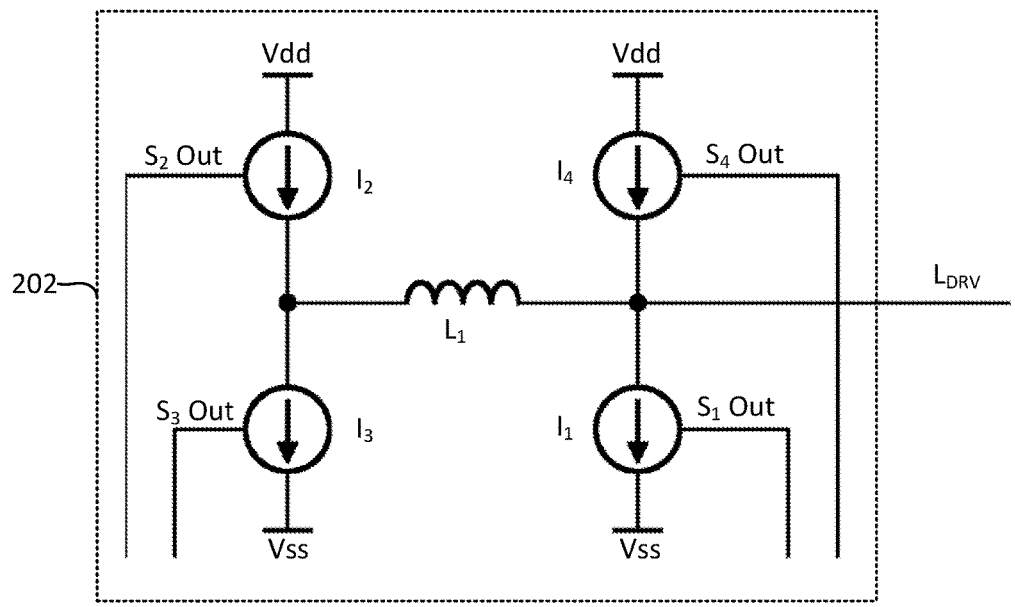
FIGS. 8A-B are simplified schematics of example bridged inductor driver circuits, in accordance with some embodiments.
Figure 8B:
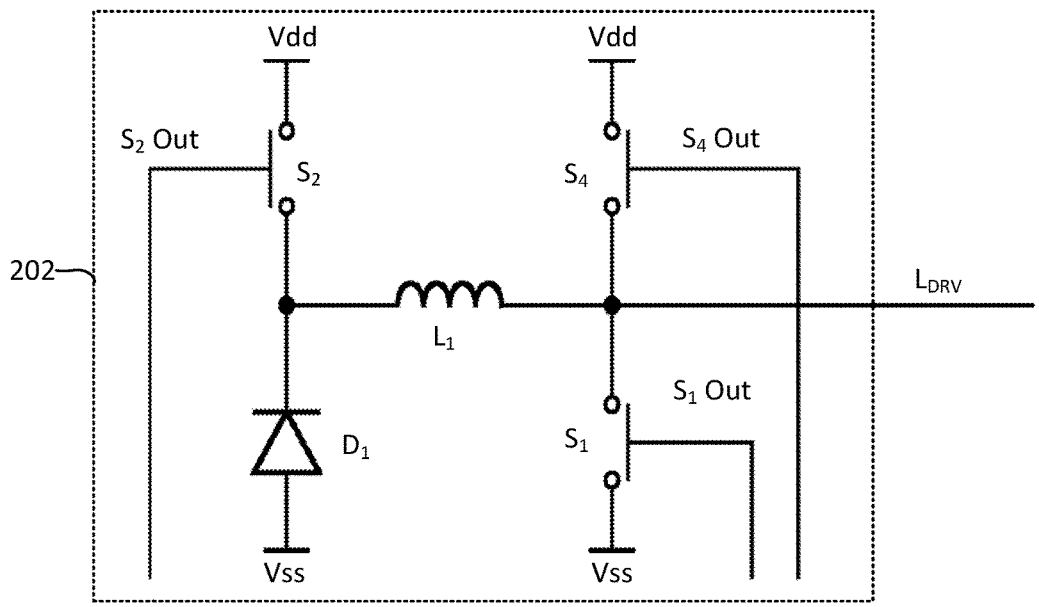
Figure 9A:
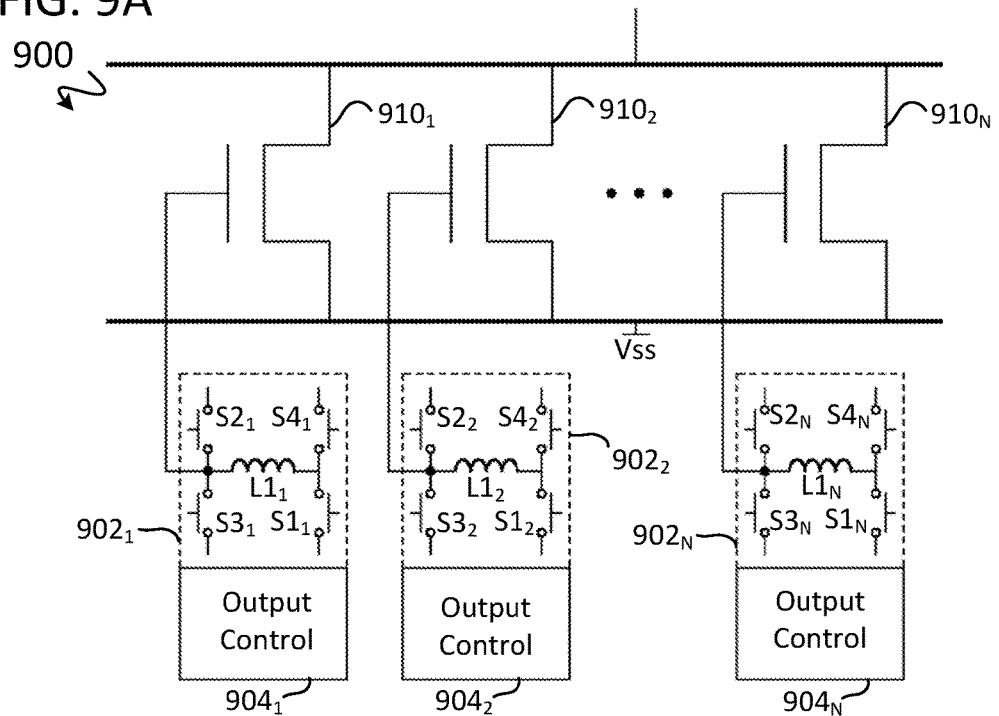
FIGS. 9A-B are simplified schematics of example control circuits, in accordance with some embodiments.
Figure 9B:
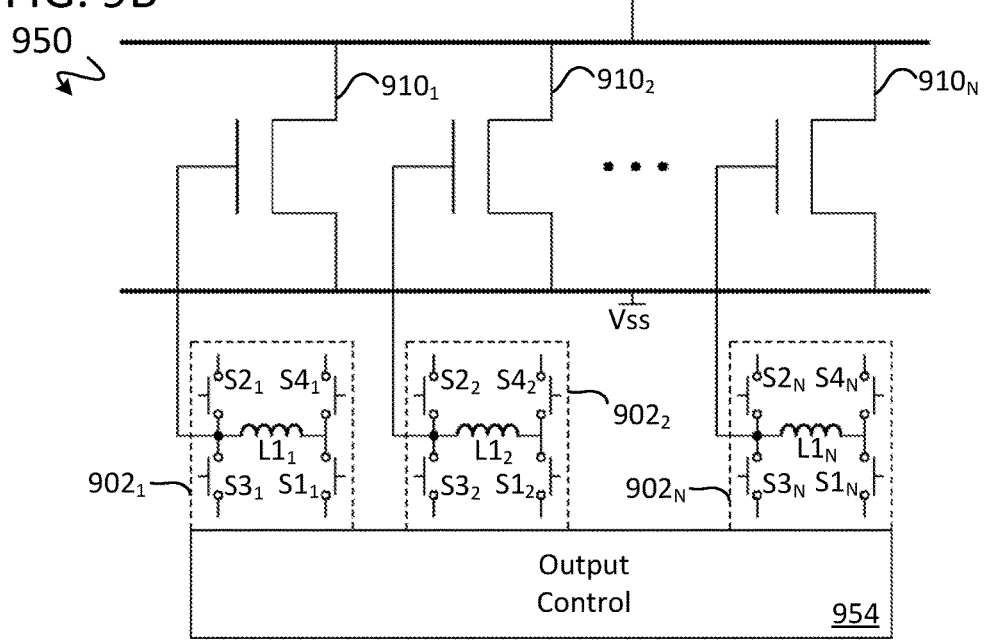

Other example embodiments of the bridged inductor driver circuit 202 of FIG. 2 are shown in FIGS. 8A-B. As shown in the simplified circuit schematic of FIG. 8A, one or more of the switches $S_{1-4}$ shown in FIG. 2 are replaced, in some embodiments, by a controllable current source $I_{2-4}$ to control the flow of current through the inductor $L_1$. As shown in the simplified circuit schematic of FIG. 8B, the switch $S_3$ shown in FIG. 2 is replaced, in some embodiments, by a diode $D_1$.

The inductance of the inductor $L_1$ and bridged inductor driver circuits may be distributed amongst a distributed power FET, in accordance with some embodiments. As shown in the simplified circuit schematics of FIGS. 9A-B, in some embodiments, the low-side FET 110 includes N fingers $910_{1-N}$. In such embodiments, the inductance of the inductor $L_1$ is distributed across the N fingers $910_{1-N}$ as inductors $L1_{1-N}$. Similarly, the bridged inductor driver circuit 202 is distributed across the N fingers as bridged inductor driver circuits $902_{1-N}$, the distributed bridged inductor driver circuits $902_{1-N}$ having, in some embodiments, switches $S1_{1-N}$, $S2_{1-N}$, $S3_{1-N}$, and $S4_{1-N}$. In some embodiments, as shown in the simplified circuit schematic 900 of FIG. 9A, the output control circuit 204 is also distributed across the N fingers as output control circuits $904_{1-N}$. As shown in the simplified circuit schematic 950 of FIG. 9B, in some embodiments, a single output control circuit 954 is coupled to each of the distributed bridged inductor driver circuits $902_{1-N}$.

In some embodiments, the high-side drive circuit 108 is similar to the low-side drive circuit 112 and is used for regenerative charging of gate capacitance of the high-side FET 106. In some embodiments, the static delay portions are set at design time and are dependent on the specific switch and inductor sizes used. In some embodiments, a monolithic integration of the low-side FET 110, the bridged inductor driver circuit 202 and the circuitry of the low-side drive circuit 112 occur on a mixed signal LDMOS process node. In some embodiments, the low-side FET 110 is a large NMOS device. In some embodiments, all or a portion of the low-side drive circuit 112 includes analog circuits rather than digital circuits. In some embodiments, a single inductor is shared amongst many power FETs (e.g., a single inductor $L_1$ coupled to respective gate nodes of multiple FETs), such as in a multi-phase design. In some embodiments, the inductor $L_1$ is constructed with bond wires on top of a chip that includes the low-side drive circuit 112. In some embodiments, the inductor $L_1$ is constructed as a traditional planar spiral inductor. In some embodiments, the inductor $L_1$ is constructed using metal layers or a redistribution layer (RDL). In some embodiments, the inductor $L_1$ is external to a chip that includes the low-side drive circuit 112 or forms a part of a multi-component hybrid. In some embodiments, the inductor $L_1$ is constructed using bond-wires that terminate off a chip that includes the low-side drive circuit 112 such that a spiral is formed away from the chip itself. Any other suitable form of on-chip or off-chip inductor as known to one of skill in the art may be used as the inductor $L_1$.

For ease of description, example embodiments described herein relate to the low-side FET 110. One of ordinary skill in the art will understand that the same or similar methods and circuits can be used to drive the high-side FET 106 or another FET entirely. In some embodiments, the FET controlled by gate driver circuits described herein is an NMOS or PMOS device. In some embodiments, the low-side drive circuit 112 is only used for charging the gate of the low-side FET 110. In some embodiments, the low-side drive circuit 112 is only used for discharging the low-side FET 110. In some embodiments, regenerative gate charging and discharging is not used during each switching cycle but is still used during some switching cycles. In some embodiments, regenerative gate charging and discharging is used during each switching cycle. In some embodiments, the signal processing circuit 206 continuously samples the gate voltage $V_G$. In some embodiments, the signal processing circuit 206 uses a Digital-to-Analog Converter instead of a comparator. In some embodiments, the signal processing circuit 206 uses an attained peak gate voltage rather than the final resting voltage for feedback. In some embodiments, analog components of the circuits described herein are replaced with digital inputs. In some embodiments, the Vdd and Vss supplies are separated from the low-voltage system rails, and may dynamically change over operating conditions. In some embodiments, tunable delay timings are controlled by an external system controller. In some embodiments, the configuration is provided by on-chip NVM, from an external source, or from a PWM signal. In some embodiments, the circuits and methods described herein are recursively applied to the switches of the bridged inductor driver circuit 202.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A circuit for regenerative gate charging, the circuit comprising:
    an inductor having a first terminal and a second terminal;
    a FET having a gate node coupled to the second terminal of the inductor;
    a bridged inductor driver circuit coupled to the first terminal of the inductor and the second terminal of the inductor, the bridged inductor driver circuit comprising a plurality of switches;
    an output control circuit coupled to the bridged inductor driver circuit;
    a sense circuit coupled to the gate node; and
    a timing control circuit coupled to the output control circuit and the sense circuit;
    wherein:
    the timing control circuit receives a first FET control signal at a first trigger time of a first switching cycle;
    the timing control circuit generates first output control signals in accordance with a first switch timing profile;
    the timing control circuit transmits the first output control signals to the output control circuit;
    the output control circuit holds one or more of the plurality of switches in an ON state for a first time period, the first time period being in accordance with the first switch timing profile;
    the output control circuit holds all of the plurality of switches in an OFF state for a second time period, the second time period being in accordance with the first switch timing profile;
    the sense circuit samples one or more first voltages of the gate node during the second time period and after an expiration of the first time period; and
    the timing control circuit uses the one or more sampled first voltages to generate a second switch timing profile for a second switching cycle.

2. The circuit of claim 1, wherein:
    the timing control circuit receives a second FET control signal at second trigger time of the second switching cycle;
    the timing control circuit generates second output control signals in accordance with the second switch timing profile; and
    the timing control circuit transmits the second output control signals to the output control circuit.

3. The circuit of claim 2, wherein the bridged inductor driver circuit comprises:
    a voltage node;
    a ground node;
    a first switch having a first high-side node coupled to the second terminal of the inductor, a first output control node coupled to the output control circuit, and a first low-side node coupled to the ground node;
    a second switch having a second high-side node coupled to the voltage node, a second output control node coupled to the output control circuit, and a second low-side node coupled to the first terminal of the inductor;
    a third switch having a third high-side node coupled to the first terminal of the inductor, a third output control node coupled to the output control circuit, and a third low-side node coupled to the ground node; and
    a fourth switch having a fourth high-side node coupled to the voltage node, a fourth output control node coupled to the output control circuit, and a fourth low-side node coupled to the second terminal of the inductor.

4. The circuit of claim 3, wherein during a charging sequence of the gate node:
    the output control circuit turns the first switch off at a first time during the second switching cycle;
    the output control circuit turns the second switch on at a second time during the second switching cycle;
    the output control circuit turns the second switch off at a third time during the second switching cycle;
    the output control circuit turns the third switch on at a fourth time during the second switching cycle;
    the output control circuit turns the third switch off at a fifth time during the second switching cycle; and
    the output control circuit turns the fourth switch on at a sixth time during the second switching cycle;
    wherein the first time, the second time, the third time, the fourth time, the fifth time, and the sixth time are in accordance with the second switch timing profile.

5. The circuit of claim 4, wherein:
    the sixth time occurs after the fifth time, the fifth time occurs after the fourth time, the fourth time occurs after the third time, and the third time occurs after the second time;
    one or more second voltages of the gate node are only sampled after the fifth time and before the sixth time; and
    the timing control circuit uses the one or more sampled second voltages to generate a third switch timing profile of a third switching cycle.

6. The circuit of claim 5, wherein:
    the first time and the second time occur at about the second trigger time; and
    the third time, the fourth time, the fifth time and the sixth time are each offset in time from the second trigger time based on respective adjustable delays, each of the respective adjustable delays having a static delay portion and a tunable delay portion.

7. The circuit of claim 5, wherein the first time occurs before the second time.

8. The circuit of claim 5, wherein the first time occurs after the second time and before the third time.

9. The circuit of claim 3, wherein during a discharging sequence of the gate node:
    the output control circuit turns the fourth switch off at a first time during the second switching cycle;
    the output control circuit turns the third switch on at a second time during the second switching cycle;
    the output control circuit turns the third switch off at a third time during the second switching cycle;
    the output control circuit turns the second switch on at a fourth time during the second switching cycle;
    the output control circuit turns the second switch off at a fifth time during the second switching cycle; and the output control circuit turns the first switch on at a sixth time during the second switching cycle;

wherein the first time, the second time, the third time, the fourth time, the fifth time, and the sixth time are in accordance with the second switch timing profile.

10. The circuit of claim 9, wherein:

the sixth time occurs after the fifth time, the fifth time occurs after the fourth time, the fourth time occurs after the third time, and the third time occurs after the second time;

one or more second voltages of the gate node are sampled after the fifth time and before the sixth time; and the timing control circuit uses the one or more sampled second voltages to generate a third switch timing profile of a third switching cycle.

11. The circuit of claim 10, wherein:

the first time and the second time occur at about the second trigger time; and the third time, the fourth time, the fifth time and the sixth time are each offset in time from the second trigger time based on respective adjustable delays, each of the respective adjustable delays having a static delay portion and a tunable delay portion.

12. The circuit of claim 10, wherein the first time occurs before the second time.

13. The circuit of claim 10, wherein the first time occurs after the second time and before the third time.

14. The circuit of claim 1, further comprising:

a digital configuration circuit, the digital configuration circuit comprising:

a switch timing profile retrieval circuit;

wherein:

the switch timing profile retrieval circuit retrieves a default switch timing profile; and the default switch timing profile is used as the first switch timing profile.

15. The circuit of claim 1, further comprising:

a plurality of adjustable delay circuits coupled to the timing control circuit; and a plurality of static delay circuits coupled to the timing control circuit;

wherein:

the first output control signals are generated during the first switching cycle using the plurality of adjustable delay circuits and the plurality of static delay circuits;

respective first adjustable delay values of the plurality of adjustable delay circuits are in accordance with the first switch timing profile during the first switching cycle;

second output control signals are generated during the second switching cycle using the plurality of adjustable delay circuits and the plurality of static delay circuits; and respective second adjustable delay values of the plurality of adjustable delay circuits are in accordance with the second switch timing profile during the second switching cycle.

16. The circuit of claim 1, wherein the FET and the bridged inductor driver circuit are integrated on a semiconductor die.

17. The circuit of claim 16, wherein the semiconductor die and the inductor are integrated into the same package.

18. The circuit of claim 17, wherein:

the FET comprises a plurality of fingers, each finger of the plurality of fingers having a distributed gate node; and the inductor comprises a plurality of distributed inductors, each of the plurality of distributed inductors having a first distributed terminal and a second distributed terminal.

19. The circuit of claim 16, wherein the timing control circuit, the output control circuit, and the sense circuit are also integrated on the semiconductor die.

20. A method for regenerative gate charging, the method comprising:

receiving a first FET control signal at a first trigger time of a first switching cycle at a timing control circuit;

generating first output control signals in accordance with a first switch timing profile using the timing control circuit;

transmitting the first output control signals to an output control circuit from the timing control circuit;

holding one or more of a plurality of switches of a bridged inductor driver circuit in an ON state for a first time period using the output control circuit, wherein the first time period is in accordance with the first switch timing profile, the bridged inductor driver circuit is coupled to an inductor, and a gate node of a FET is coupled to the inductor;

holding all of the plurality of switches in an OFF state for a second time period using the output control circuit, wherein the second time period is in accordance with the first switch timing profile;

sampling one or more voltages of the gate node during the second time period and after an expiration of the first time period using a sense circuit, wherein the sense circuit is coupled to the gate node and is coupled to the timing control circuit; and using the one or more sampled voltages at the timing control circuit to generate a second switch timing profile for a second switching cycle.

* * * * *